US009305654B2

(12) United States Patent
Parat et al.

(10) Patent No.: US 9,305,654 B2
(45) Date of Patent: Apr. 5, 2016

(54) ERASE AND SOFT PROGRAM FOR VERTICAL NAND FLASH

(71) Applicant: Intel Corporation, Santa Clara, CA (US)

(72) Inventors: Krishna K. Parat, Palo Alto, CA (US); Pranav Kalavade, San Jose, CA (US); Koichi Kawai, Orange, CA (US); Akira Goda, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 322 days.

(21) Appl. No.: 13/719,558

(22) Filed: Dec. 19, 2012

(65) Prior Publication Data

US 2014/0169093 A1    Jun. 19, 2014

(51) Int. Cl.
| | | |
|---|---|---|
| G11C 11/34 | (2006.01) |
| G11C 16/04 | (2006.01) |
| G11C 16/16 | (2006.01) |
| G11C 8/12 | (2006.01) |
| G11C 16/34 | (2006.01) |

(52) U.S. Cl.
CPC ...... *G11C 16/16* (2013.01); *G11C 8/12* (2013.01); *G11C 16/3409* (2013.01); *G11C 16/3445* (2013.01)

(58) Field of Classification Search
None
See application file for complete search history.

(56) References Cited

U.S. PATENT DOCUMENTS

| | | | |
|---|---|---|---|
| 5,719,808 A * | 2/1998 | Harari et al. | 365/185.33 |
| 7,768,835 B2 | 8/2010 | Goda | |
| 2008/0175069 A1* | 7/2008 | Wang et al. | 365/185.29 |
| 2011/0199825 A1* | 8/2011 | Han et al. | 365/185.11 |

OTHER PUBLICATIONS

Kanda, et al., "A 120mm2 16Gb 4-MLC NAND Flash Memory with 43nm CMOS Technology", Non-Volatile Memory, IEEE International Solid-State Circuits Conference, Feb. 6, 2008, pp. 429-431.

* cited by examiner

*Primary Examiner* — Kretelia Graham
(74) *Attorney, Agent, or Firm* — Alpine Technology Law Group LLC

(57) ABSTRACT

Methods, and apparatuses to erase and or soft program a block of NAND memory may include performing an erase cycle on a block of NAND memory comprising two or more sub-blocks, verifying the two or more sub-blocks until a sub-block fails to verify, stopping the verification in response to the failed verify, performing another erase cycle on the block of NAND memory, and re-starting to verify the two or more sub-blocks at the sub-block that failed to verify.

22 Claims, 9 Drawing Sheets

ERASE AND SOFT PROGRAM FOR VERTICAL NAND FLASH

BACKGROUND

The present subject matter relates to semiconductor memories, and more specifically, to three-dimensional vertical NAND flash memory.

Many types of semiconductor memory are known. Some memory is volatile and will lose its contents if power is removed. Some memory is non-volatile and will hold the information stored in the memory even after power has been removed. One type of non-volatile memory is flash memory which stores charge in a charge storage region of a memory cell. In a floating gate flash cell, a conductive floating gate, positioned between the control gate and the channel of a metal-oxide silicon field effect transistor (MOSFET or just FET), is used to store a charge. In a charge trap flash (CTF) cell, a layer of non-conductive material, such as a nitride film, is used to store charge between the control gate and the channel of a MOSFET. The voltage threshold of the MOSFET-based flash cell can be changed by changing the amount of charge stored in the charge storage region of the cell, and the voltage threshold can be used to indicate a value that is stored in the flash cell.

Some flash devices may store a single binary bit of data per cell. Such flash cells may be referred to as single-level cells (SLC). Other flash devices may allow for more than one binary bit of data to be stored in a single flash cell by using multi-level cells (MLC). In an MLC, the voltage threshold of the flash cell may be set to one of $2^n$ different target levels to represent 'n' bits of storage. So for example, an MLC capable of storing 3 bits of information may have 8 different targeted voltage levels for its voltage threshold.

One architecture in common use for flash memories is a NAND flash architecture. In a NAND flash architecture, two or more flash cells are coupled together, source to drain, into a string, with the individual cell control gates coupled to control lines, such as word lines. Select gates, which may be standard FETs, may be coupled to the NAND string at either end, to couple the NAND string to a source line at one end of the NAND string, and to a bit line at the other end of the NAND string. Some NAND flash memories may use MLCs to increase storage density.

Some NAND flash strings may be fabricated vertically, with the memory cells of the NAND string stacked on top of each other. Vertically stacking the memory cells may provide a much higher density of memory per unit area. In some embodiments, the vertically stacked memory cells may share a common body and be coupled to a source line by a select gate source FET at the bottom of the string and be coupled to a bit line by a select gate drain FET at the top of the string.

BRIEF DESCRIPTION OF THE DRAWINGS

The accompanying drawings, which are incorporated in and constitute part of the specification, illustrate various embodiments. Together with the general description, the drawings serve to explain various principles. In the drawings.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification. Reference now is made in detail to the examples illustrated in the accompanying drawings and discussed below.

Figure 1:
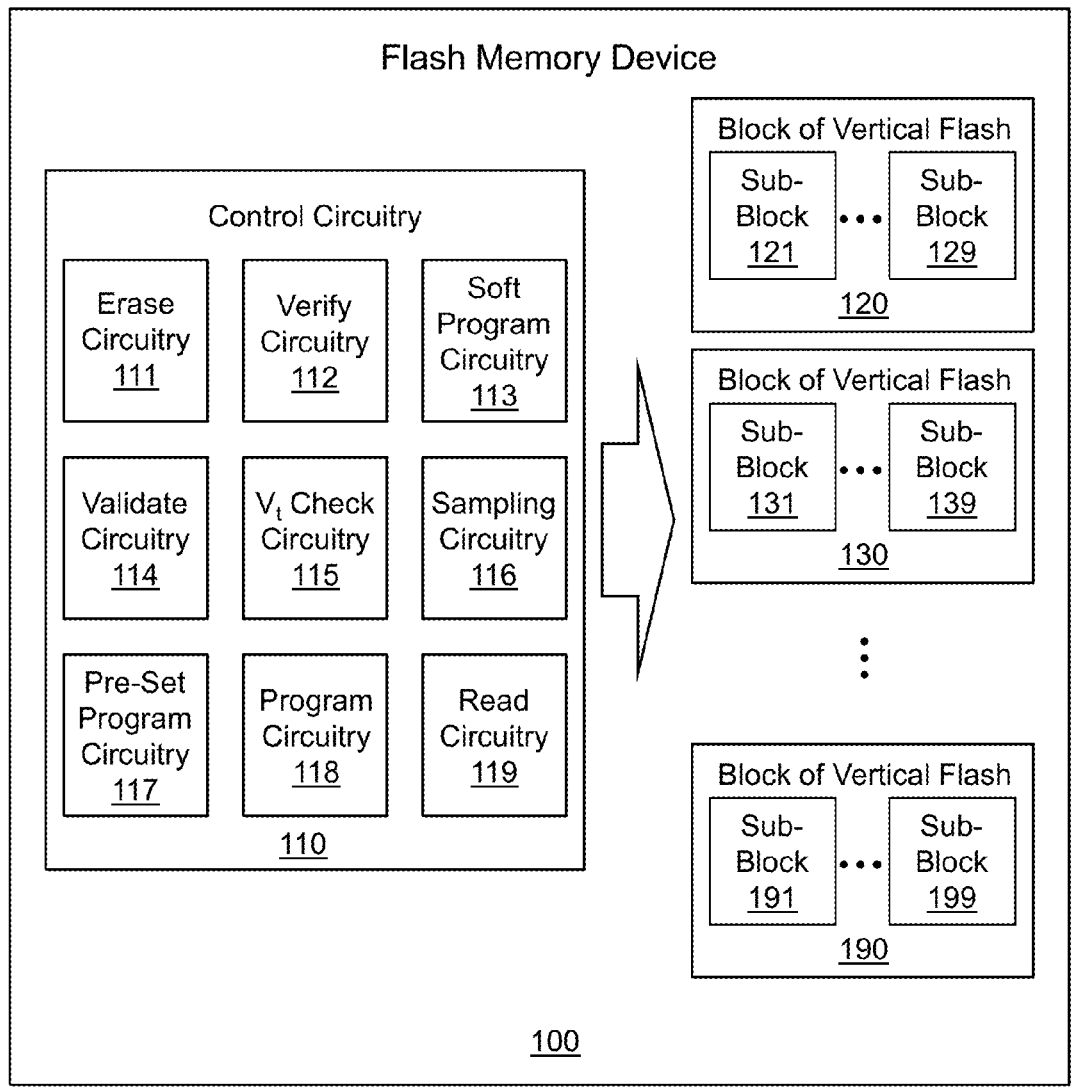
FIG. 1 is a block diagram of a vertical NAND flash memory device including various embodiments.
Figure 2:
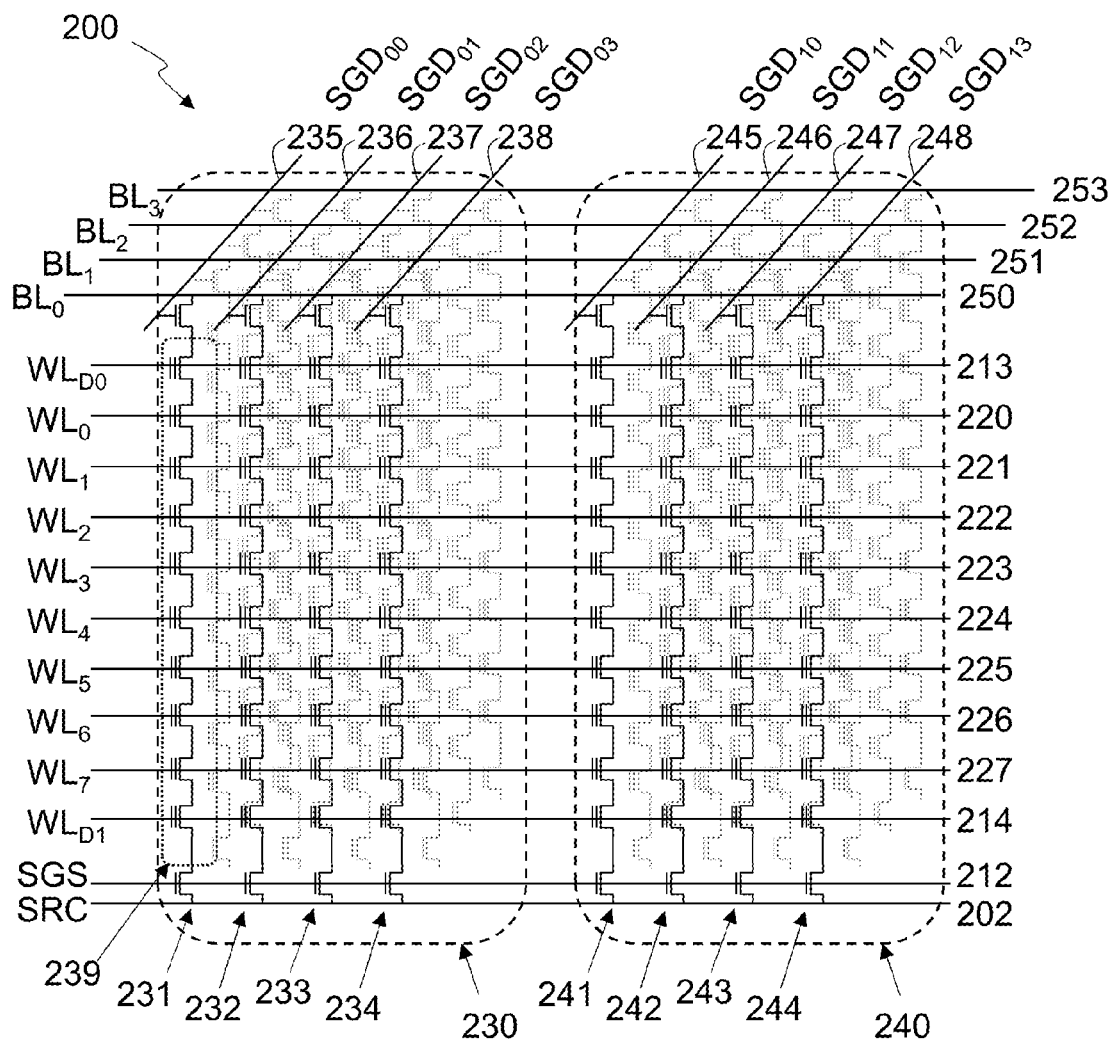
FIG. 2 is a partial schematic of a floating gate NAND flash memory device suitable for use in in embodiments.

FIG. 1 is a block diagram of a vertical NAND flash memory device 100 including various embodiments. The memory device 100 may include any number of blocks of vertical flash memory 120, 130, 190 of any size. The various blocks of memory 120, 130, 190 may contain the same number of memory locations in embodiments, although some embodiments may have blocks of memory with a different numbers of memory locations. A block of memory may be subdivided into any number of sub-blocks of memory with sub-blocks 121-129 included in memory block 120, sub-blocks 131-139 included in memory block 130, and sub-blocks 191-199 included in memory block 190 in the example shown in FIG. 1. A block of memory may be any number of bits wide with one bit line per bit of the block of memory coupled to the various sub-blocks of the block. In embodiments, a sub-block may include a vertical NAND string per bit line coupled to the block of memory as shown in FIG. 2, so that one vertical NAND string from the various sub-blocks of the block of memory is coupled to an individual bit line.

Control circuitry 110 may also be included in the memory device 100 to perform various cycles and/or operations. While the block diagram shows the various circuitry elements 111-119 as separate circuits, some embodiments may utilize common circuitry for some or all of the cycles and/or operations discussed. The control circuitry 110 may be implemented as one or more finite state machines, one or more sequencers running microcode, one or more processors executing instructions, or any combination of those or other circuit elements, depending on the embodiment. The control circuitry 110 may perform certain cycles on an entire block of memory at once, such as an erase cycle, other cycles on a sub-block at a time, such as a verify cycle, and other cycles on an individual word, such as a read cycle. A word may be defined as one cell respectively from the one or more NAND strings of a sub-block. While several example circuit blocks of the control circuitry 110 perform cycles and/or operations on the memory are described below, some embodiments may not perform all of the cycles and/or operations and therefore may not include circuitry to perform those cycles and/or operations. Other embodiments may include circuitry to perform other cycles and/or operations not described herein and some embodiments may implement the cycles and/or operations described differently than described herein.

Figure 5:
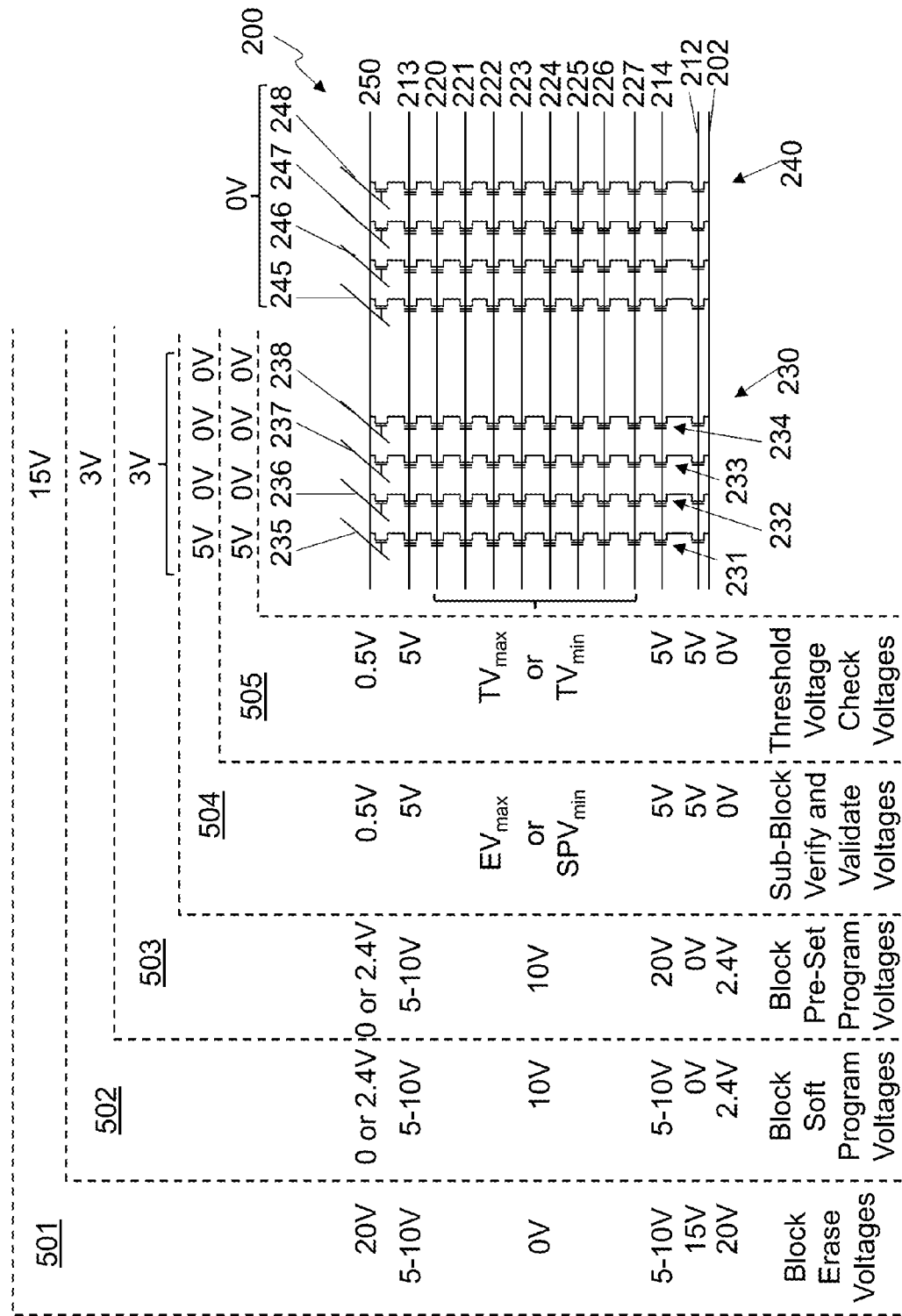
FIG. 5 shows example voltages applied to selected lines of a NAND flash memory device for embodiments of various cycles.

Embodiments may include erase circuitry 111 to erase one or more blocks of memory 120, 130, 190. Erasing a block of memory, such as block 120, may be defined as changing the threshold voltage ($V_t$) of the flash cells in the block of memory 120 to a low voltage, such as below 0V in some embodiments. Some embodiments may perform an erase cycle on one block of memory at a time but other embodiments may allow multiple blocks to be erased in one cycle. Example voltages for an erase cycle in at least one embodiment are shown in FIG. 5.

Verify circuitry 112 may be included in some embodiments to ensure that the erase cycle successfully lowered $V_t$ in the block of memory, such as block of memory 120. For the purposes of this disclosure and the associated claims, verify refers to checking that $V_t$ of a sub-block or block of memory are below a predetermined maximum voltage for a flash memory cell to be deemed as erased. The maximum voltage to deem as erased may be different between embodiments and may even change in a single embodiment between various operations. For example a first maximum voltage may be used to verify the cells of a block of memory immediately after an erase cycle, followed by additional cycles and/or operations, then a second maximum voltage, which may be different than the first maximum voltage, may be used for a final verify. Example voltages for a verify cycle in at least one embodiment are also shown in FIG. 5.

In some embodiments, a verify may performed on a sub-block basis, and in at least one embodiment, the verify may be performed serially on the sub-blocks of a block of memory until a sub-block fails to pass the verify. The serial verify may be stopped in response to the failed verify and another erase cycle may be performed on the block of memory. The serial verify may then be re-started at the sub-block that failed to verify. In some embodiments the re-started serial verify may be stopped in response to another failure to verify a sub-block, followed by performing another erase cycle and re-starting the serial verify on the sub-block that failed to verify. The process may then be repeated until all the sub-blocks have been successfully verified. Some embodiments may include a maximum number of erase cycles performed on a single block of memory before the verify operation is aborted and an error is indicated.

Soft program circuitry 113 may be included in some embodiments to increase and tighten the distribution of $V_t$ for the erased state. An increased $V_t$ may reduce $V_t$ shift during subsequent programming of cells and reduce interference between adjacent floating gates in a string. Example voltages for a soft program cycle in at least one embodiment are also shown in FIG. 5. A soft program cycle may be performed on a block of memory after an erase cycle or after a verify operation in some embodiments.

Validate circuitry 114 may be included in some embodiments to ensure that a soft program cycle raised $V_t$ to a desired level. Example voltages for a validate cycle in at least one embodiment are also shown in FIG. 5. For the purposes of this disclosure and the associated claims, validate refers to checking that $V_t$ of at least one cell of a sub-block or block of memory is above a soft program voltage minimum. In at least one embodiment, the soft program voltage minimum may be about −0.5 volts. In some embodiments, a validate operation may be performed serially on the sub-blocks of the block of memory, and in at least one embodiment, the validate may be performed on a subset of the sub-blocks of a block of memory. If no sub-blocks in the subset validate, another soft program cycle may be performed and the sub-blocks of the subset validated again, repeating until at least one sub-block validates successfully. In some embodiments, the soft program cycle and validation of the subset of sub-blocks may be repeated until all the sub-blocks of the subset are validated. Some embodiments may also include a limit to the number of times that a soft program cycle may be repeated on a block of memory before the validate operation is aborted and an error reported.

$V_t$ check circuitry 115 may be included in some embodiments to check the threshold voltage ($V_t$) of the sub-blocks to identify sub-blocks that have $V_t$ above a target maximum value and/or $V_t$ below a target minimum value after an erase cycle. Various values may be used for the target maximum value and the target minimum value but in at least some embodiments, the target maximum value may be lower than the voltage used for a verify operation, and the target minimum value may be higher than an absolute minimum value of $V_t$ for an erased cell. Example voltages for a $V_t$ check cycle in at least one embodiment are also shown in FIG. 5.

Some embodiments may include sampling circuitry 116 to determine a subset of sub-blocks within a block of memory to be validated. Any method may be used to determine the subset, depending on the embodiment. Some embodiments may have a fixed subset determined at design time, such as the even sub-blocks, the odd sub-blocks, the end and middle sub-blocks, a fixed pseudo-random subset or any other subset. Other embodiments may dynamically select a subset during operation, such as a pseudo-random subset, a subset that includes one or more sub-blocks that failed to verify after an erase cycle, and/or a subset that includes sub-blocks identified during checks of the $V_t$ by the $V_t$ check circuitry 115.

Pre-set program circuitry 117 may be included in some embodiments having dummy cells included in the blocks of memory 120, 130, 190. Dummy cells may be extra flash cells added at the ends of a NAND string that may not be used for data storage. The pre-set program circuitry 117 may be used to program one or more of the dummy cells to have a positive $V_t$, which may be useful in minimizing electric fields at the ends of the NAND string in inhibited sub-blocks during programming of other sub-blocks. Example voltages for a pre-set program cycle in at least one embodiment are also shown in FIG. 5.

Embodiments may include program circuitry 118 to write a word to a block of memory and read circuitry 119 to read a word from a block of memory. The program circuitry 118 may raise $V_t$ of at least one cell to store data in that cell and the read circuitry 119 may provide a differentiating voltage to the cell and sense whether or not the cell conducts to determine what data is stored in the cell.

FIG. 2 is a partial schematic of a floating gate NAND flash memory device 200 suitable for use in embodiments. Two blocks of memory 230, 240 are shown that include four sub-blocks 231-234, 241-244 of eight four-bit words that are coupled to four bit lines, $BL_0$ 250, $BL_1$ 251, $BL_2$ 252 and $BL_3$ 253 with the schematic for the bit of memory coupled to $BL_0$ 250 in both blocks of memory 230, 240 clearly shown and the schematic for the other bits of memory of the blocks of memory 230, 240, which may be similar to the schematic for the bit shown but coupled to the other bit lines 251-253, not clearly shown so as to not overly clutter the schematic for better understanding. Additional dummy cells may be included in the blocks of memory that are not used for data storage. Embodiments may include any number of blocks of memory and may have more than two blocks of memory coupled to a bit line with additional blocks of memory coupled to different sets of bit lines. Embodiments may also include any number of sub-blocks that may include any number of words and the words may include any number of bits coupled to respective bit lines.

A single bit of a sub-block, such as the zeroth bit of sub-block 231, may be built from a single NAND string 239 of flash cells. While floating gate flash cells are shown in the schematic, other embodiments may use other flash technologies such as charge-trap flash. A NAND string may be coupled to word lines with one word line coupled to a single cell of the NAND string. In the embodiment shown, the NAND string 239 has eight flash cells used for storage that are respectively coupled to $WL_0$ 220, $WL_1$ 221, $WL_2$ 222, $WL_3$ 223, $WL_4$ 224, $WL_5$ 225, $WL_6$ 226, and $WL_7$ 227, and dummy cells at each end of the NAND string 239 coupled to $WL_{D0}$ 213 and $WL_{D1}$ 214. In at least some embodiments, the NAND strings of the other bits of the sub-block 231, as well as the other sub-blocks 232-234 of the block of memory 230 and even other blocks of memory 240, may be coupled to the same word lines 220-227, 213-214.

The NAND string 239 may be coupled to a source line (SRC) 202 by a select gate source FET that is controlled by a select gate source line (SGS) 212. In at least some embodiments, all of the NAND strings in the block of memory 230 may be coupled to the same SRC line 202 under control of a common SGS line 212. The NAND string 239 may be coupled to a bit line 250 by a select gate drain FET that is controlled by a select gate drain line ($SGD_{00}$) 235. The NAND strings of a single sub-block 231 may couple to a common select gate drain line but different sub-blocks 232-234 of the block of memory 230 couple to different select gate drain lines 236-238, so that the four NAND strings of the first sub-block 231 couple to $SGD_{00}$ 235, the four NAND strings of the second sub-block 232 couple to $SGD_{01}$ 236, the four NAND strings of the third sub-block 233 couple to $SGD_{02}$ 237, and the four NAND strings of the fourth sub-block 234 couple to $SGD_{03}$ 238. The sub-blocks 241-244 of the second block 240 may couple to different select gate drain lines 245-248.

Figure 3:
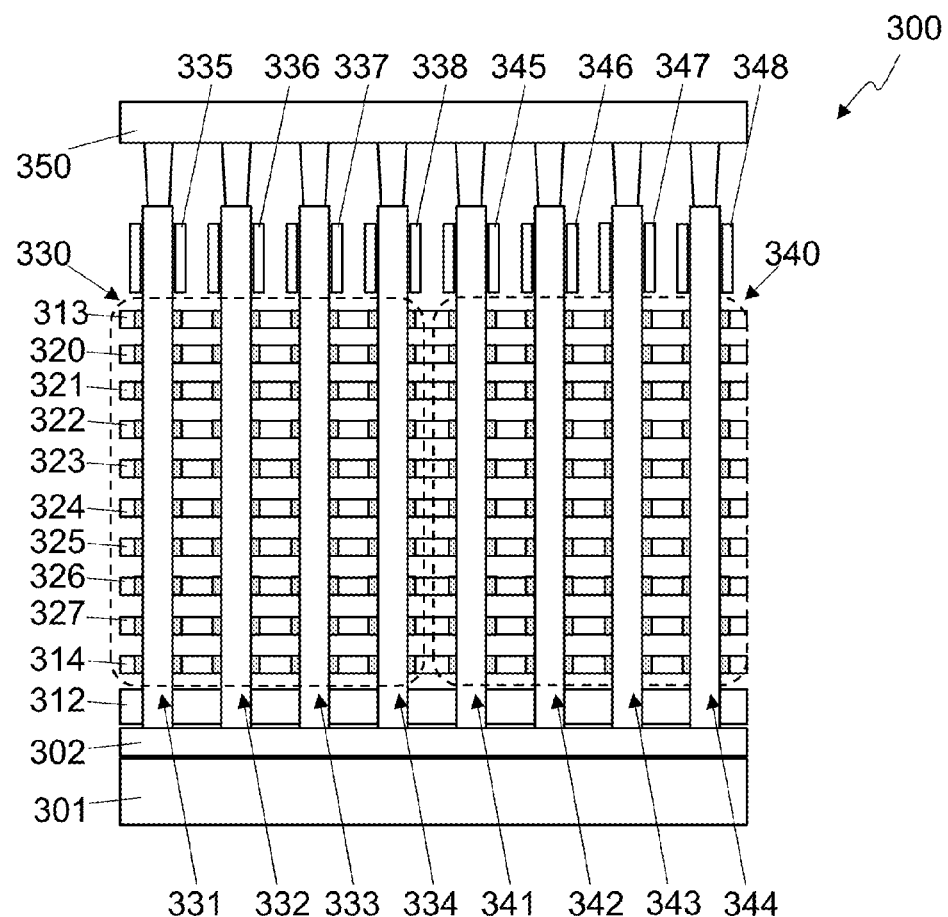
FIG. 3 is a cross sectional view of a portion of a vertical NAND flash memory device suitable for use in embodiments.

FIG. 3 is a cross sectional view of a portion of a vertical NAND flash memory device 300 which may correspond to a single bit of the floating gate NAND flash device 200 shown in FIG. 2. The grey rectangles represent charge storage areas that may include charge trap flash films, floating gates, or some other charge storage mechanism for the flash cells. The portion of the vertical NAND flash memory device 300 shown includes a portion of two blocks of memory 330, 340 that are coupled to a single bit line 350, although embodiments may have any number of blocks of memory. The first block of memory 330 includes a first sub-block 331, a second sub-block 332, a third sub-block 333 and a fourth sub-block 334. The second block of memory 340 includes a first sub-block 341, a second sub-block 342, a third sub-block 343 and a fourth sub-block 344. While four sub-blocks are shown per block of memory, other embodiments may have any number of sub-blocks per block of memory including hundreds or even thousands of sub-blocks or more. Additional bits may be included in the sub-blocks 331-334, 341-344 that are coupled to other bit lines that would be either in front of and/or behind the page showing the cross-sectional view.

The vertical NAND flash memory 300 may be built on a substrate 301 and may include a source line 302 located in or above the substrate. A bit of a sub-block may be implemented as a single vertical NAND string as shown for sub-blocks 331-334, 341-344. A vertical NAND string may be coupled to a select gate source line 312 that may be used to control a select gate source FET at the bottom of the vertical NAND string to selectively electrically couple a vertical NAND string to the source line 302. The vertical NAND string may include any number of flash cells stacked vertically on the select gate source FET, such as the one dummy cell, eight flash cells and another dummy cell built stacked on the select gate source FET as shown in FIG. 3. Some embodiments may not include any dummy cells and other embodiments may include two or more dummy cells on each end of the stack of cells. One dummy cell may be coupled to a first dummy word line 313, the eight flash cells may be coupled to eight word lines 320-327, and the other dummy cell may be coupled to a second dummy word line 314.

Select gate drain FETs may be stacked on top of the flash cells to couple the NAND strings to the bit line 350 and may be controlled by a select gate drain line (SGD) 335-338, 345-348. A sub-block may be coupled to, and its select gate drain FET controlled by, a different select gate drain line than the other sub-blocks, so that sub-block 331 is coupled to $SGD_{00}$ 335, sub-block 332 is coupled to $SGD_{01}$ 336, sub-block 333 is coupled to $SGD_{02}$ 337, sub-block 334 is coupled to $SGD_{03}$ 338, sub-block 341 is coupled to $SGD_{10}$ 345, sub-block 342 is coupled to $SGD_{11}$ 346, sub-block 343 is coupled to $SGD_{12}$ 347, and sub-block 344 is coupled to $SGD_{13}$ 348. A vertical NAND string may share a common body between its cells and the common body may also be used by the select gate source FET and the select gate drain FET.

Figure 4:
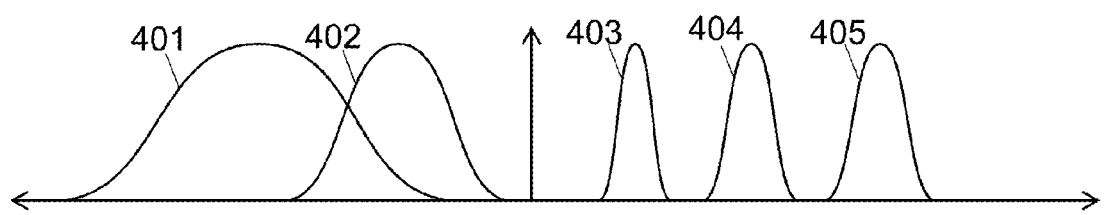
FIG. 4 shows example distributions of threshold voltages for various states of a flash memory cell in some embodiments.

FIG. 4 shows example distributions 401-405 of threshold voltages for various states of a flash memory cell in some embodiments. The horizontal axis may represent threshold voltage ($V_t$) and the vertical axis, which may be located at about 0 volts, may represent a percentage of cells over a large number of blocks of memory that have a particular threshold voltage while in a particular state. The blocks of memory represented may be distributed over multiple die of multiple manufacturing lots. FIG. 4 shows distributions 401-405 for five different states. A state may represent one or more bits of data stored in the cell. In some embodiments, a cell may hold a single bit of data and may be referred to as a single level cell (SLC). Other embodiments may store two or more bits of data in a multi-level cell (MLC). In at least one embodiment, the MLC can store up to two bits of information by having its voltage threshold set to a level in one of four different voltage ranges. In the example shown, the data stored is $00_2$ if the $V_t$ of the cell is in distribution 405, the data stored is $10_2$ if the $V_t$ of the cell is in distribution 404, the data stored is $01_2$ if the $V_t$ of the cell is in distribution 403 and the data stored is $11_2$, which may also be an erased cell, if the $V_t$ of the cell is in distribution 401 or distribution 402. In embodiments that store 'n' bits of data in the MLC, at least $2^n$ non-overlapping distributions of $V_t$ for a cell may be defined to represent the data.

Distribution 401 may represent the distribution of Vt after an erase cycle is performed. In the example shown, the highest voltages of the range of distribution 401 are well below 0 volts and the range of distribution 401 may be quite wide compared to other distributions 403, 404, 405 that represent other data values. Reliability of the flash device may be increased if the range of the $11_2$ distribution 401 is decreased and if the gap between the $11_2$ distribution and the $01_2$ distribution 403 is decreased. In some embodiments a soft program cycle may be performed to raise the $V_t$ of cells after they are erased. Distribution 402 may represent the distribution of $V_t$ after a soft program cycle. The upper end of distribution 402 may be referred to as the soft program voltage minimum and may be used for validation cycles. Some embodiments may perform multiple soft program cycles to continue to raise and/or narrow the distribution of $V_t$ until specific parameters are satisfied.

FIG. 5 shows example voltages 501-505 applied to selected lines of the NAND flash memory device 200 for embodiments of various cycles. It should be understood that the exact voltages and timings for various cycles and operations are very dependent on the embodiment, and the voltages shown are representative of one potential embodiment and should not be limiting to the rest of this disclosure or claims. No timing is provided in these examples, but the various voltages shown may be held for a limited amount of time to change the charge stored in the cells, thereby adjusting the $V_t$ of various cells to the desired voltage. One of skill may determine specific voltages and timings appropriate for a particular embodiment.

The NAND flash memory device 200 may be the same device as shown in FIG. 2 with only the NAND strings coupled to a single bit line 250 shown. In all the cycles shown in FIG. 5, the second block of memory is inhibited by driving the SGD lines 245-248 that are coupled to the NAND strings of the second block 240 to about 0 volts (V).

Erase cycle voltages 501 are shown for a cycle to erase the first block of memory 230. The erase cycle may be intended to reduce $V_t$ of the cells of the block of memory 230 to a voltage level as shown by distribution 401 in FIG. 4. To erase block of memory 230, the source line 202 and bit line 250 may be driven to about 20V while the SGS line 212 and the SGD lines 235-238 are driven to about 15V to allow the body of the NAND strings to rise to near 15V. The word lines 220-227 may be held at about 0V to create a reverse field across the charge storage regions and change $V_t$ to be less than about 0V. In some embodiments the dummy word lines 213-214 may also be driven to about 0V, but in the embodiment shown, the dummy word lines 213-214 may be driven to a positive voltage, such as between about 5V and about 10V to keep a positive $V_t$ on the dummy cells.

Soft program cycle voltages 502 are shown for a cycle to soft program the first block of memory 230. The soft program cycle may be intended to raise $V_t$ of the cells of the block of memory 230 and narrow the distribution of $V_t$ after an erase cycle to the distribution 402 shown in FIG. 4. To soft program the block of memory 230, the source line 202 may be driven to about 2.4V while the SGS line 212 is held at about 0V and the SGD lines 235-238 are driven to about 3V. The bit line 250 may be driven to about 0V or about 2.4V depending on whether it is desired to soft-program that bit of the block of memory 230. If the bit of the block of memory 230 that is coupled to the bit line 250 is to be soft programmed, the bit line 250 may be driven to about 0V. If the bit of the block of memory 230 that is coupled to the bit line 250 has an acceptable $V_t$ and is not to be soft programmed, the bit line 250 may be driven to about 2.4V. The word lines 220-227 may be driven to about 10V to create a field across the charge storage region and raise $V_t$. In some embodiments the dummy word lines 213-214 may also be driven to about 10V, but in the embodiment shown, the dummy word lines 213-214 may be driven to a voltage between about 5V and about 10V.

Pre-set program voltages 503 are shown for a cycle to preset at least some of the dummy cells in the first block of memory 230. The preset program cycle may be intended to raise $V_t$ of at least some of the dummy cells of the block of memory 230. To pre-set program the block of memory 230, the source line 202 may be driven to about 2.4V while the SGS line 212 is held at about 0V and the SGD lines 235-238 are driven to about 3V. The bit line 250 may be driven to about 0V or about 2.4V depending on whether it is desired to pre-set program that bit of the block of memory 230. If the bit of the block of memory 230 that is coupled to the bit line 250 is to be pre-set programmed, the bit line 250 may be driven to about 0V. If the bit of the block of memory 230 that is coupled to the bit line 250 has an acceptable $V_t$ and is not to be pre-set programmed, the bit line 250 may be driven to about 2.4V. The word lines 220-227 may be driven to about 10V and the word line 213 coupled to the dummy cells that are not being programmed is driven to between about 5V and 10V. The dummy word line 214 that is coupled to the dummy cells being programmed may be driven to about 20V to raise the $V_t$ of the lower dummy cells of the block of memory 230. In some embodiments one pre-set program cycle may be run to pre-set the dummy cells coupled to a single dummy word line with multiple pre-set program cycles run to pre-set program all of the dummy cells. Other embodiments may drive multiple dummy word lines to about 20V to program multiple dummy cells per NAND string.

Sub-block verify and validate cycle voltages 504 are shown to verify or validate a sub-block. A verify cycle may check that no cell of sub-block has a $V_t$ above an erase voltage maximum ($EV_{max}$) which may be a negative voltage for some verify cycles and a higher voltage for other verify cycles in at least one embodiment. A validate cycle may check that at least one cell of the NAND string has a $V_t$ above a soft program voltage minimum ($SPV_{min}$) which may be about −0.5V in at least one embodiment. During a verify or validate cycle for a sub-block 231 of block of memory 230, the source line 202 is held to about 0V with the bit line 250 at about 0.5V. The SGS line 212 and the SGD line 235 may be driven to about 5V to select the sub-block 231 with SGD lines 236-238 held at about 0V to inhibit sub-blocks 232-234. The dummy word lines 213-214 may be driven to about 5V to turn on the dummy cells and the word lines-220-227 driven to $EV_{max}$ for a verify cycle and to $SPV_{min}$ for a validate cycle.

At the end of the verify or validate cycle the bit line 250 may be checked to see if the NAND string was conductive and pulled the bit line 250 to the voltage of the source line 202. If the NAND string was conductive, all of the cells of the NAND string were turned on by the voltage on their control gate. If the cycle was a verify cycle and the NAND string was conductive, the NAND string was successfully erased because the data storage cells of that NAND string have a $V_t$ below $EV_{max}$. If all the NAND strings of the sub-block were successfully erased, the sub-block was successfully erased. If at least one NAND string was non-conductive, meaning that the bit line 250 was not pulled to the voltage level of the source line 202, the sub-block was not successfully erased and the sub-block may be deemed to have failed to verify.

If the cycle was a validate cycle and at least one NAND string of the sub-block was non-conductive, at least one cell in that NAND string has a $V_t$ above $SPV_{min}$ and the sub-block may be deemed to be validated. In other embodiments, a sub-block may be deemed to be validated if some number greater than one of the NAND strings in the sub-block is non-conductive and at least one embodiment may deem a sub-block validated only if all the NAND strings of that sub-block are non-conductive.

Threshold check cycle voltages 505 are shown to allow a check of $V_t$ compared to a target maximum voltage ($TV_{max}$) or target minimum voltage ($TV_{min}$). The threshold check cycle is very similar to a verify/validate cycle, except for the voltage used for the word lines 220-227. The threshold check cycles may be used to help determine a subset of sub-blocks to be validated.

Figure 6:
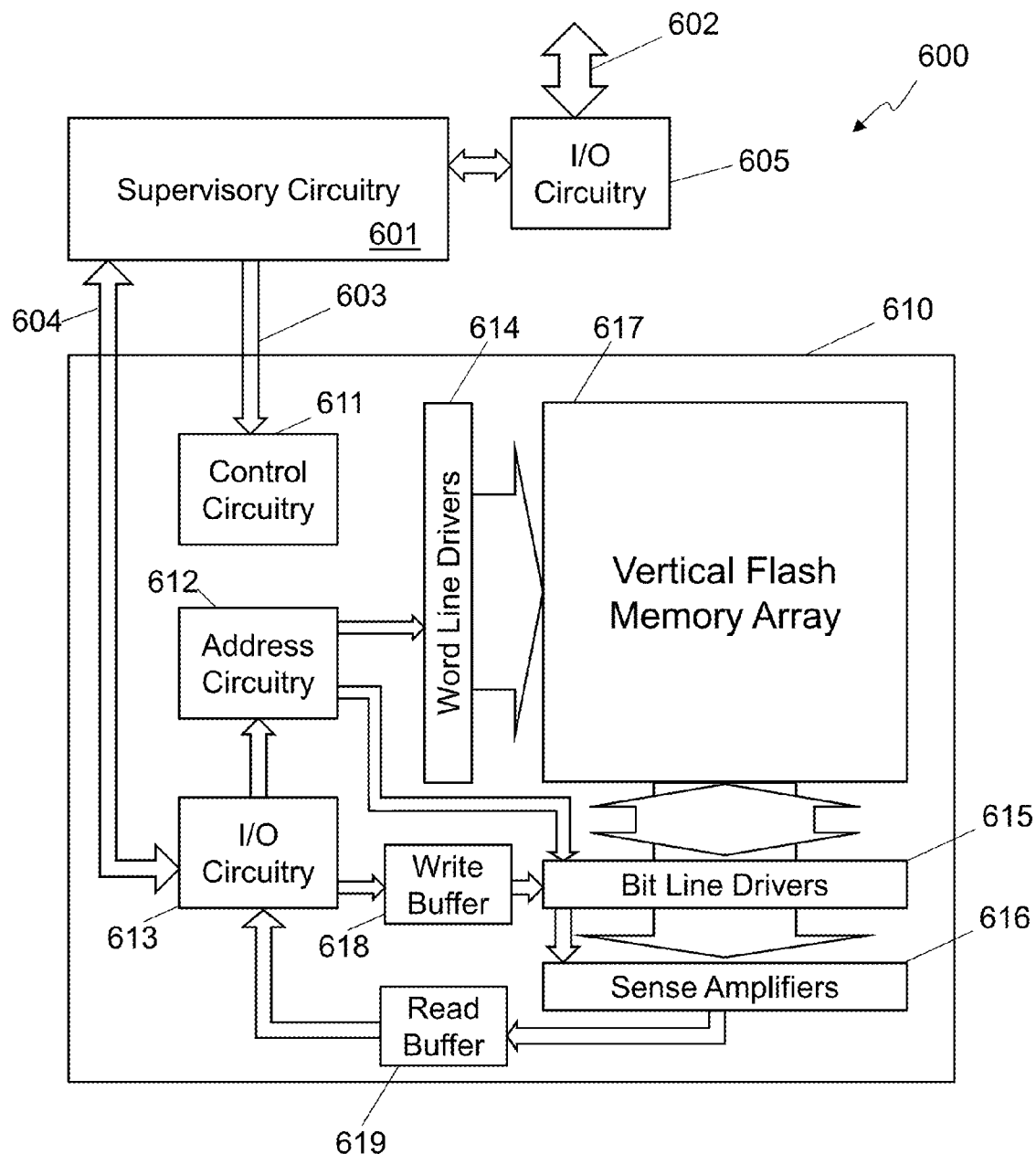
FIG. 6 is a block diagram of an electronic system using one or more embodiment.

FIG. 6 is a block diagram of an electronic system 600 using one or more embodiment. The electronic system 600 may include memory device 610 using a vertical NAND flash memory array 617 with various erase and/or soft program operations supported by the control circuitry 611 of the memory device 610. Supervisory circuitry 601 is coupled to the memory device 610 with control/address lines 603 and data lines 604. In some embodiments, data and control may utilize the same lines. In at least one embodiment, a memory access protocol compliant, at least in part, with a version of the Open NAND Flash Interface (ONFI) specification, such as the Open NAND Flash Interface (ONFI) Specification Revision 3.0, published on Mar. 9, 2011 by the ONFI Workgroup and available for download from www.onfi.org, may be used for communication between the supervisory circuitry 601 and the memory device 610. The supervisory circuitry 601 may include a processor, microprocessor, microcontroller, finite state machine, or some other type of controlling circuitry. The supervisory circuitry 601 may execute instructions of a program in some embodiments. In some embodiments, the supervisory circuitry 601 may be integrated in the same package or even on the same die as the memory device 610. In some embodiments, the supervisory circuitry 601 may be integrated with the control circuitry 611, allowing some of the same circuitry to be used for both functions. The supervisory circuitry 601 may have external memory, such as random access memory (RAM) and read only memory (ROM), used for program storage and intermediate data or it may have internal RAM or ROM. In some embodiments, the supervisory circuitry 601 may use the memory device 610 for program or data storage. A program running on the supervisory circuitry 601 may implement many different functions including, but not limited to, an operating system, a file system, memory block remapping, and error management.

In some embodiments an external connection 602 is provided. The external connection 602 is coupled to input/output (I/O) circuitry 605 which may then be coupled to the supervisory circuitry 601 and allows the supervisory circuitry 601 to communicate to external devices. In some embodiments, the I/O circuitry 605 may be integrated with the supervisory circuitry 601 so that the external connection 602 is directly coupled to the supervisory circuitry 601. If the electronic system 600 is a storage system, the external connection 602 may be used to provide an external device with non-volatile storage. The electronic system 600 may be a solid-state drive (SSD), a USB thumb drive, a secure digital card (SD Card), or any other type of storage system. The external connection 602 may be used to connect to a computer or other intelligent device such as a cell phone or digital camera using a standard or proprietary communication protocol. Examples of computer communication protocols that the external connection 602 may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express (PCI-e).

If the electronic system 600 is a computing system, such as a mobile telephone, a tablet, a notebook computer, a set-top box, or some other type of computing system, the external connection 602 may be a network connection such as, but not limited to, any version of the following protocols: Institute of Electrical and Electronic Engineers (IEEE) 802.3, IEEE 802.11, Data Over Cable Service Interface Specification (DOCSIS), digital television standards such as Digital Video Broadcasting (DVB)-Terrestrial, DVB-Cable, and Advanced Television Committee Standard (ATSC), and mobile telephone communication protocols such as Global System for Mobile Communication (GSM), protocols based on code division multiple access (CDMA) such as CDMA2000, and Long Term Evolution (LTE).

The memory device 610 may include an array 617 of memory cells. The memory cells may be organized into three dimensional stacks of memory cells, such as vertical NAND strings. Address lines and control lines 603 may be received and decoded by control circuitry 611, I/O circuitry 613 and address circuitry 612 which may provide control to the memory array 617 through the word line drivers 614 and bit line drivers 615. The control circuitry 611, in conjunction with the other blocks of the memory device 610, may perform one or more of the methods described in FIG. 7-10. I/O circuitry 613 may couple to the data lines 604 allowing data to be received from and sent to the processor 601. Data read from the memory array 617 may be determined by the sense amplifiers 616 and temporarily stored in read buffers 619. Data to be written to the memory array 617 may be temporarily stored in write buffers 618 before being transferred to the memory array 617.

The system illustrated in FIG. 6 has been simplified to facilitate a basic understanding of the features of the system. Many different embodiments are possible including using a single supervisory circuitry 601 to control several memory devices 610 to provide for more storage space. Additional functions, such as a video graphics controller driving a display, and other devices for human oriented I/O may be included in some embodiments.

Figure 7:
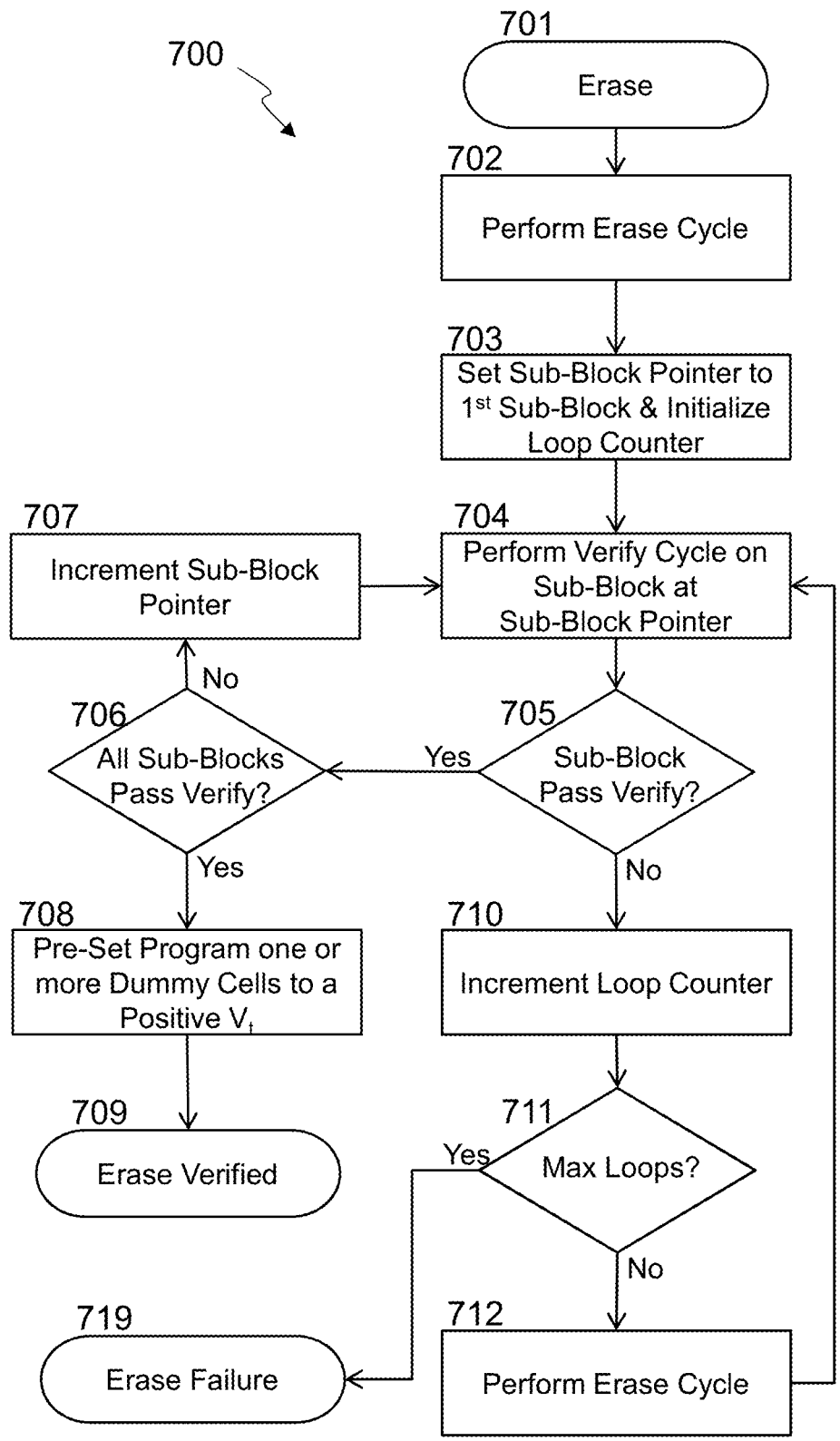
FIG. 7 is a flowchart of an embodiment of a method to erase and verify a block of memory in a NAND flash memory device.

FIG. 7 is a flowchart 700 of an embodiment of a method to erase and verify a block of memory in a NAND flash memory device. The method may begin at flowbox 701 to start an erase operation and continue by performing an erase cycle on a block of NAND memory that includes two or more sub-blocks at flowbox 702. The erase cycle may be similar to that described in FIG. 5. In embodiments, a sub-block includes a vertical NAND string, and the vertical NAND string of the two or more sub-blocks of the block of NAND memory are coupled to a common bit line. A verify operation may commence after the erase cycle. In some embodiments, the memory device may initiate a verify operation independently after an erase operation but in other embodiments, the verify operation may be initiated by a second command to the memory device. The method may continue by verifying the two or more sub-blocks serially until a sub-block fails to verify. In some particular embodiments, the sub-blocks are accessed sequentially, and in other embodiments the sub-blocks are not accessed in any particular order, and the scope of the claimed subject matter is not limited in this respect. The serial verification may be accomplished by setting a sub-block pointer to the first sub-block of a block and, in some embodiments, initializing a loop counter, at flowbox 703, performing a verify cycle at flowbox 704, similar to the verify cycle shown in FIG. 5, and checking to see if the sub-block passed the verify at flowbox 705. If the sub-block verified, a check may be made at flowbox 706 to see if all sub-blocks of the blocks have passed verification. If not, the sub-block pointer may be incremented at flowbox 707 and a verify cycle may be performed on the next sub-block at flowbox 704.

If a sub-block fails to verify at flowbox 705, the serial verification may be stopped in response to the failed verify. The loop counter may be incremented at flowbox 710 in some embodiments, and a check to see if a maximum number loops including an erase cycle have occurred may be made at flowbox 711. If the maximum number of loops have occurred, the erase/verify operation may be stopped and an error returned at flowbox 719. If the maximum allowable number of loops have not occurred, or if no maximum loop count is included in an embodiment, the method may continue by performing, or executing, another erase cycle on the block of NAND memory at flowbox 712. The method may then continue by re-starting to serially verify the two or more sub-blocks at the sub-block that failed to verify at flowbox 704. So embodiments may include stopping the re-started serial verify in response to another failure to verify a sub-block, performing another erase cycle on the block of NAND memory, re-starting to serially verify the two or more sub-blocks at the sub-block that last failed to verify, and repeating until no sub-blocks in the block of NAND memory fail to verify. After all the sub-blocks are verified, some embodiments may include pre-set programming one or more dummy cells of the two or more sub-blocks of the block of NAND memory to have a positive threshold voltage at flowbox 708 before a successful verify is completed at flowbox 709.

Figure 8:
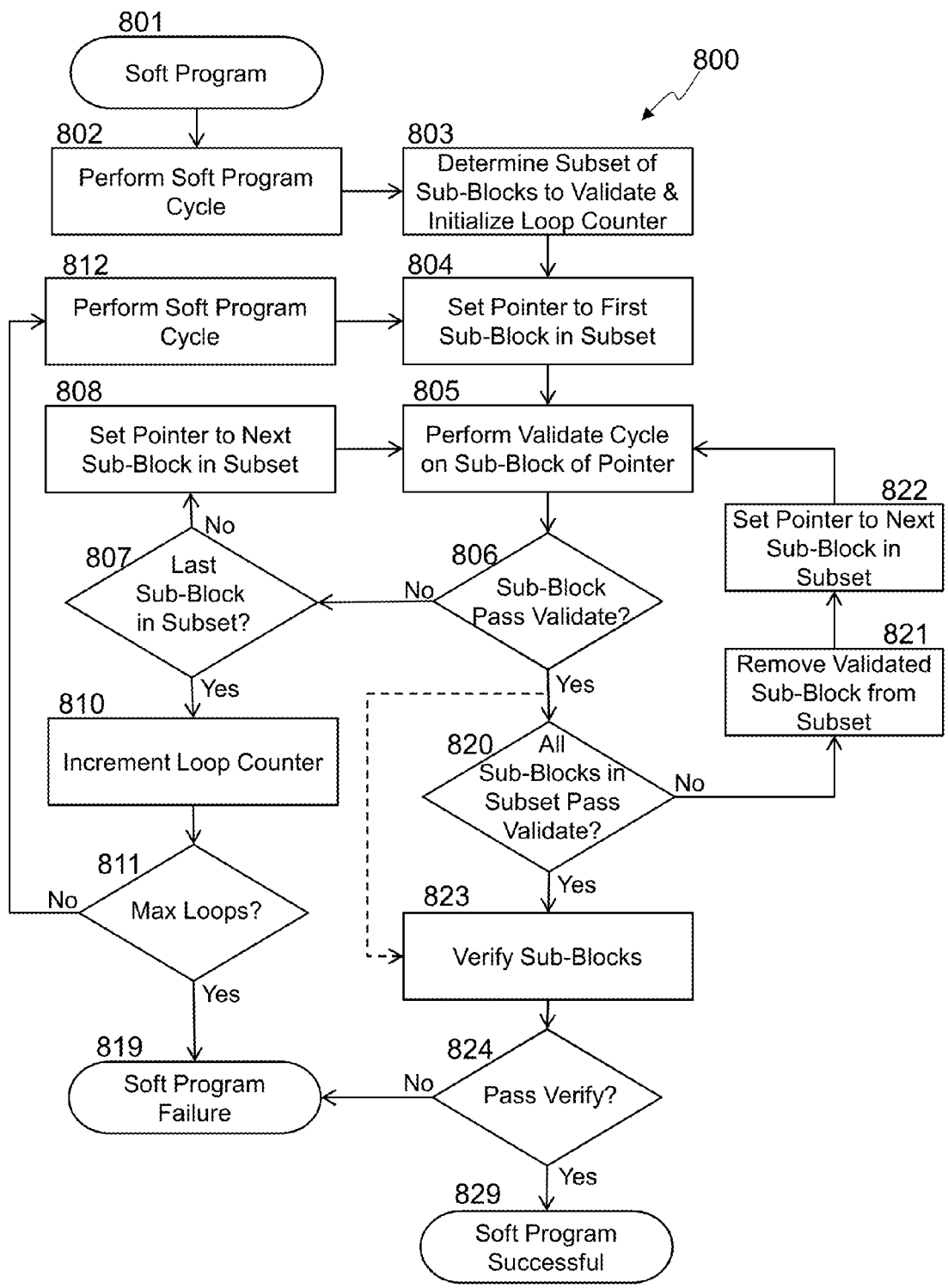
FIG. 8 is a flowchart of an embodiment of a method to soft-program and validate a block of memory in a NAND flash memory device.

FIG. 8 is a flowchart 800 of an embodiment of a method to soft-program and validate a block of memory in a NAND flash memory device. A soft program may start at flowbox 801 after an erase cycle. In some embodiments the soft program and validate may be initiated after the sub-blocks are verified in the method of flowchart 700 of FIG. 7, and may occur without additional commands in some embodiments, although other embodiments may perform the soft program cycle and/or the validate operation in response to additional commands to the memory device. In other embodiments the method of flowchart 800 may be performed directly after an erase cycle without a verify or after a traditional verify operation. The method starts by performing a soft program cycle, which may be similar to that described in FIG. 5, on the block of NAND memory at flowbox 802.

The method may continue by determining a subset of the two or more sub-blocks, and in some embodiments, initializing a loop counter, at flowbox 803. Any method may be used to determine the subset, depending on the embodiment. Some embodiments may have a fixed subset determined at design time, such as the even sub-blocks, the odd sub-blocks, the end and middle sub-blocks, a fixed pseudo-random subset or any other subset. Other embodiments may dynamically select a subset during operation, such as a pseudo-random subset, a subset of sub-blocks that failed to verify at least once, and in at least one embodiment the subset of the two or more sub-blocks includes a last sub-block to verify in the method described in FIG. 7.

The method may continue by validating the subset of the two or more sub-blocks serially which in the embodiment shown may include setting a pointer to the first sub-block in the subset at flowbox 804 and performing a validate cycle on the sub-block indicated by the pointer at flowbox 805. The validate cycle may be similar to that described in FIG. 5. The results of the validate cycle may be checked at flowbox 806 and if the sub-block is not validated a check may be made to see if the sub-block pointer is set to the last sub-block of the subset at flowbox 807. If the sub-block pointer is not pointing at the last sub-block of the subset, the pointer is set to the next sub-block in the subset at flowbox 808 and a validate cycle performed on the sub-block indicated by the pointer at flowbox 805.

If the sub-block pointer is set to the last sub-block of the subset at flowbox 807, the loop counter may be incremented at flowbox 810 in some embodiments and checked against a maximum number of allowable loops including a soft-program cycle at flowbox 811. If the maximum number of allowable loops has occurred, a soft program failure may be indicated at flowbox 819. If the number of loops does not exceed the maximum at flowbox 811, or if the embodiment does not have a maximum number of loops allowable, another soft program cycle may be performed, or executed, on the block of memory at flowbox 812 and then the pointer reset to the first sub-block in the subset.

If a sub-block is validated successfully at flowbox 806 some embodiments may check at flowbox 820 to see if all sub-blocks in the subset have been successfully validated. If not all sub-blocks are determined to have been successfully validated at flowbox 820, the sub-block that was successfully validated may be removed from the subset at flowbox 821 and the pointer set to the next sub-block in the subset at flowbox 822. A validate cycle may then be performed on that sub-block at flowbox 805.

If all sub-blocks in the subset have been successfully validated, which may be determined by there being no more sub-blocks remaining in the subset, or in some embodiments, without checking, at flowbox 820, to see if all the sub-blocks of the subset have been validated, the sub-blocks of the block of memory may be verified at flowbox 823. The verify operation of flowbox 823 may be similar to the verify operation shown in FIG. 7 or may be a traditional verify operation. If the verify operation does not pass at flowbox 824, the soft program operation may have failed and be indicated as such at flowbox 819. If the verify operation passes at flowbox 824, the soft program may be successful and complete at flowbox 829. So the method may include executing another soft program cycle on the block of NAND memory if none of the sub-blocks of the subset of the two or more sub-blocks passes validation and may include repeating the validating and the executing until at least one of the sub-blocks of the subset of the two or more sub-blocks passes validation. In some embodiments, the method may include repeating the validating and the executing until all of the sub-blocks of the subset of the two or more sub-blocks pass validation, and the validating may skip sub-blocks after they have validated.

Figure 9:
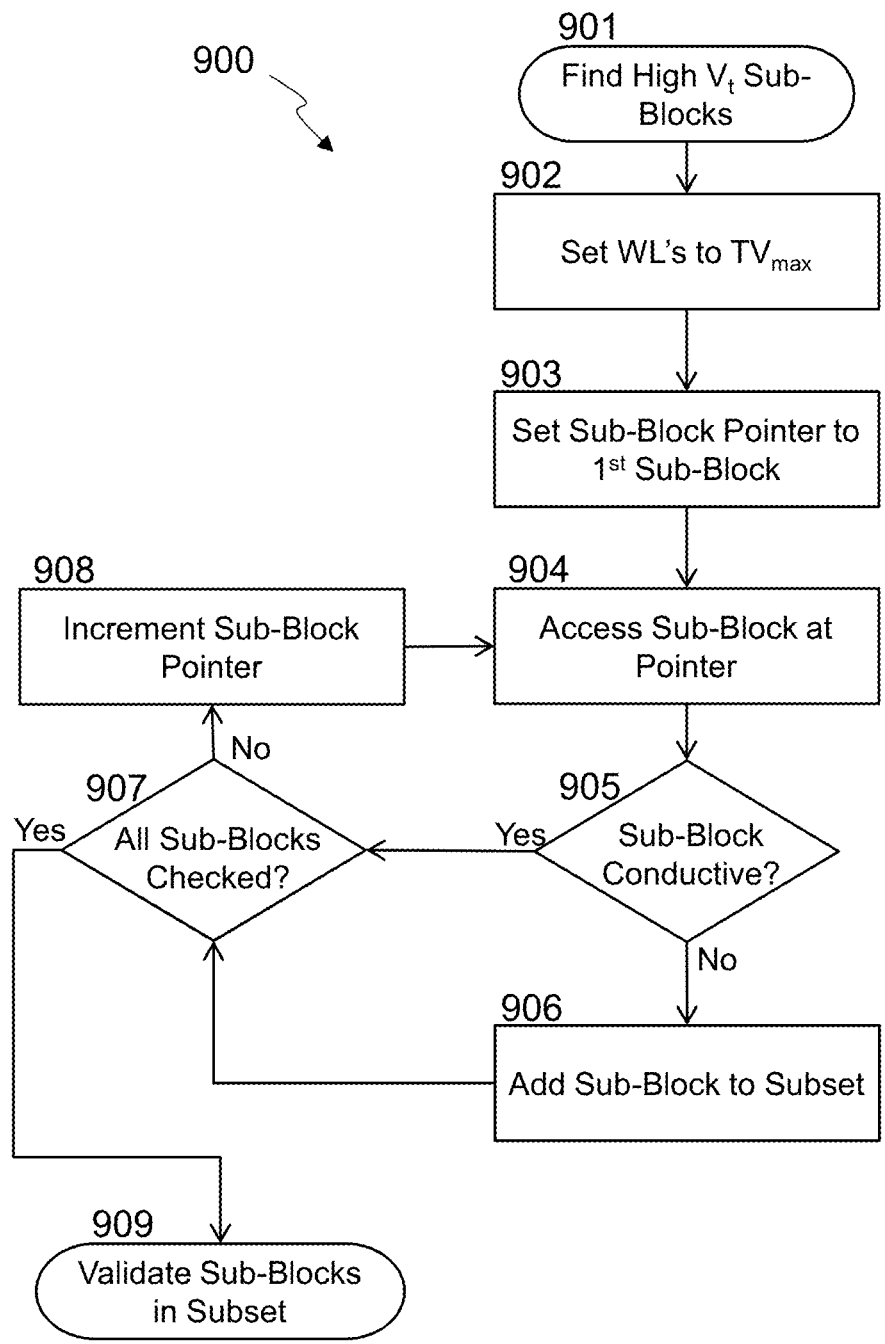
FIG. 9 is a flowchart of an embodiment of a method to determine sub-blocks to include in a subset of sub-blocks.

FIG. 9 is a flowchart 900 of an embodiment of a method to determine sub-blocks to include in a subset of sub-blocks. The method may be used in flowbox 803 of FIG. 8 to determine a subset for validation and may be used with the method shown in FIG. 10 and/or other methods of determining sub-blocks to include in the subset. The method may include checking threshold voltages ($V_t$) of the two or more sub-blocks against a target maximum voltage ($TV_{max}$), and including sub-blocks that have a $V_t$ higher than $TV_{max}$ in the subset of the two or more sub-blocks. The method may set the word lines of a block of memory to $TV_{max}$ at flowbox 902 and a sub-block pointer may be set to the first sub-block of the block of memory at flowbox 903. The threshold check voltage cycle as shown in FIG. 5 may be run at flowbox 904 and the conductivity of the sub-block during the threshold voltage cycle checked at flowbox 905. If the sub-block is not conductive, the sub-block has at least one cell with a $V_t$ greater than $TV_{max}$ so the sub-block is added to the subset at flowbox 906. An assessment may be made at flowbox 907 to see if all sub-blocks in the block of memory have been checked, and if they have not, the sub-block pointer may be incremented at flowbox 908 and threshold check voltage cycle run on the next sub-block at flowbox 904. Other embodiments may not check all of the sub-blocks in a block of memory. Once all the sub-blocks of the block of memory have been checked, the sub-blocks in the subset may be validated at flowbox 909, which may be done according to the method shown in FIG. 8.

Figure 10:
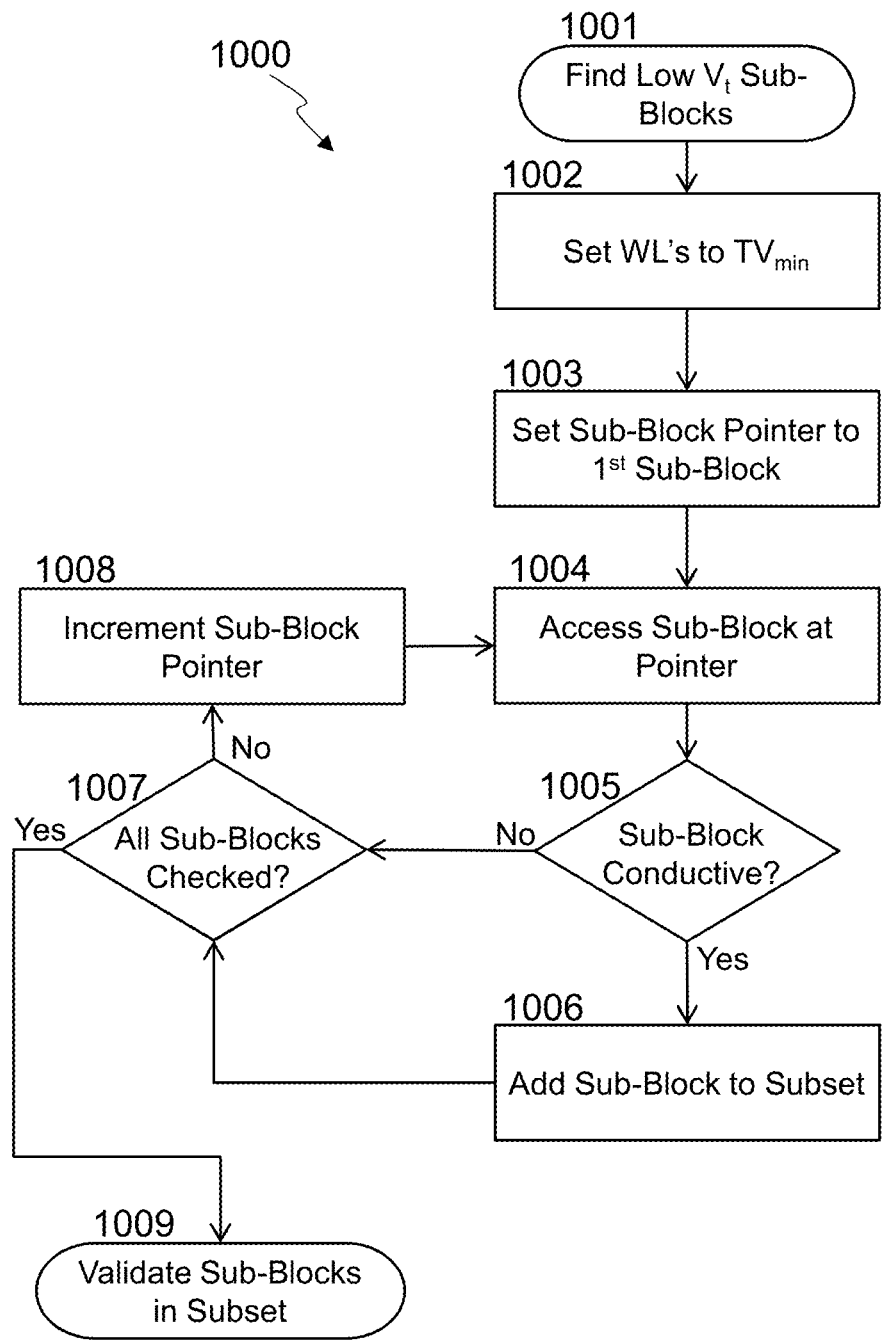
FIG. 10 is a flowchart of an alternate embodiment of a method to determine sub-blocks to include in a subset of sub-blocks.

FIG. 10 is a flowchart of an alternate embodiment of a method to determine sub-blocks to include in a subset of sub-blocks. The method of flowchart 1000 may be used in flowbox 803 of FIG. 8 to determine a subset for validation and may be used with the method shown in FIG. 9 and/or other methods of determining sub-blocks to include in the subset. The method of flowchart 1000 may include checking threshold voltages ($V_t$) of the two or more sub-blocks against a target minimum voltage ($TV_{min}$), and including sub-blocks that have a $V_t$ lower than $TV_{min}$ in the subset of the two of more sub-blocks. The method may set the word lines of a block of memory to $TV_{min}$ at flowbox 1002 and a sub-block pointer may be set to the first sub-block of the block of memory at flowbox 1003. The threshold check voltage cycle as shown in FIG. 5 may be run at flowbox 1004 and the conductivity of the sub-block during the threshold voltage cycle checked at flowbox 1005. If the sub-block is conductive, the sub-block's cells have a $V_t$ less than $TV_{min}$ so the sub-block is added to the subset at flowbox 1006. An assessment may be made at flowbox 1007 to see if all sub-blocks in the block of memory have been checked, and if they have not, the sub-block pointer may be incremented at flowbox 1008 and threshold check voltage cycle run on the next sub-block at flowbox 1004. Other embodiments may not check all of the sub-blocks in a block of memory. Once the sub-blocks of the block of memory have been checked, the sub-blocks in the subset may be validated at flowbox 1009, which may be done according to the method shown in FIG. 8.

The flowchart and/or block diagrams in the figures help to illustrate the architecture, functionality, and operation of possible implementations of systems, and methods of various embodiments. Various blocks in the flowcharts and block diagrams may represent hardware, software, or a combination, even within a single FIGURE. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

Examples of various embodiments are described in the following paragraphs:

An example method to erase a block of NAND memory may include performing an erase cycle on a block of NAND memory including two or more sub-blocks, verifying the two or more sub-blocks until a sub-block fails to verify, stopping the verification in response to the failed verify, performing another erase cycle on the block of NAND memory, and re-starting to verify the two or more sub-blocks at the sub-block that failed to verify. In some example methods, the sub-blocks may be verified serially. In some example methods, a sub-block may include a vertical NAND string, and the vertical NAND string of the two or more sub-blocks of the block of NAND memory are coupled to a common bit line. Some example methods may also include: (a) stopping the re-started verify in response to another failure to verify a sub-block, (b) performing another erase cycle on the block of NAND memory, (c) re-starting to verify the two or more sub-blocks at the sub-block that last failed to verify, and repeating (a), (b) and (c) until no sub-blocks in the block of NAND memory fail to verify. Some example methods may also include performing a soft program cycle on the block of NAND memory, determining a subset of the two or more sub-blocks, validating sub-blocks of the subset, executing another soft program cycle on the block of NAND memory if none of the sub-blocks of the subset passes validation, repeating the validating and the executing until at least one of the sub-blocks of the subset passes validation, and re-verifying the two or more sub-blocks. In some example methods, the sub-blocks may be validated serially. Some example methods may also include performing a soft program cycle on the block of NAND memory, determining a subset of the two or more sub-blocks, validating sub-blocks of the subset, executing another soft program cycle on the block of NAND memory if at least one of the sub-blocks of the subset fails validation, repeating the validating and the executing until all of the sub-blocks of the subset pass validation, and re-verifying the two or more sub-blocks, where the validating skips sub-blocks after they have passed validation. In some example methods, the subset includes a last sub-block to verify. In some example methods, the determining the subset may include checking threshold voltages of the two or more sub-blocks against a target maximum voltage, and including sub-blocks that have a threshold voltage higher than the target maximum voltage in the subset. In some example methods, the determining the subset may include checking threshold voltages of the two or more sub-blocks against a target minimum voltage, and including sub-blocks that have a threshold voltage lower than the target minimum voltage in the subset. Some example methods may also include programming one or more dummy cells of the two or more sub-blocks of the block of NAND memory to have a positive threshold voltage. Any combination of the examples of this paragraph may be used in embodiments.

An example method to erase a block of NAND memory may include erasing a block of NAND memory including two or more sub-blocks, performing a soft program cycle on the block of NAND memory, determining a subset of the two or more sub-blocks, validating sub-blocks of the subset, executing another soft program cycle on the block of NAND memory if none of the sub-blocks of the subset pass validation, and repeating the validating and the executing until at least one of the sub-blocks of the subset passes validation. In some example methods, the sub-blocks may be validated serially. Some example methods may also include verifying the two or more sub-blocks. Some example methods may also include: (a) validating sub-blocks of the subset again, (b) performing another soft program cycle on the block of NAND memory, and repeating (a) and (b) until all of the sub-blocks of the subset pass validation, where the validating skips a sub-block after the sub-block has passed validation. In some example methods, the determining the subset may include checking threshold voltages of the two or more sub-blocks against a target maximum voltage, and including sub-blocks that have a threshold voltage higher than the target maximum voltage in the subset. In some example methods, the determining the subset may include checking threshold voltages of the two or more sub-blocks against a target minimum voltage, and including sub-blocks that have a threshold voltage lower than the target minimum voltage in the subset. Some example methods may also include programming one or more dummy cells of the two or more sub-blocks of the block of NAND memory to have a positive threshold voltage. Any combination of the examples of this paragraph may be used in embodiments.

An example electronic apparatus may include a block of NAND memory including two or more sub-blocks coupled to a bit line, a sub-block including a NAND string of two or more memory cells coupled to the bit line, and circuitry coupled to the block of NAND memory. The circuitry of the example electronic apparatus may be configured to perform an erase cycle on the block of NAND memory, verify the two or more sub-blocks until a sub-block fails to verify, stop the verification in response to the failed verify, perform another erase cycle on the block of NAND memory, and re-start to verify the two or more sub-blocks at the sub-block that failed to verify. In some example electronic apparatuses, the circuitry may also be configured to verify the sub-blocks serially. In some example electronic apparatuses, the circuitry may also be configured to (a) stop the re-started verify in response to another failure to verify a sub-block, (b) perform another erase cycle on the block of NAND memory, (c) re-start to verify the two or more sub-blocks at the sub-block that last failed to verify, and repeat (a), (b) and (c) until no sub-blocks in the block of NAND memory fail to verify. In some example electronic apparatuses, the circuitry may also be configured to perform a soft program cycle on the block of NAND memory, determine a subset of the two or more sub-blocks, validate sub-blocks of the subset, execute another soft program cycle on the block of NAND memory if at least one of the sub-blocks of the subset fails validation, repeat the validation and the execution until all of the sub-blocks of the subset passes validation, and re-verify the two or more sub-blocks, where the validation skips sub-blocks after they have passed validation. In some example electronic apparatuses, the circuitry may also be configured to validate the sub-blocks serially. In some example electronic apparatuses, the circuitry may also be configured to perform a soft program cycle on the block of NAND memory, determine a subset of the two or more sub-blocks, validate sub-blocks of the subset, execute another soft program cycle on the block of NAND memory if none of the sub-blocks of the subset passes validation, repeat the validation and the execution until at least one of the sub-blocks of the subset passes validation, and re-verify the two or more sub-blocks. In some example electronic apparatuses the subset includes a last sub-block to verify. In some example electronic apparatuses, the circuitry may also be configured to check threshold voltages of the two or more sub-blocks against a target maximum voltage, and include sub-blocks that have a threshold voltage higher than the target maximum voltage in the subset. In some example electronic apparatuses, the circuitry may also be configured to check threshold voltages of the two or more sub-blocks against a target minimum voltage, and include sub-blocks that have a threshold voltage lower than the target minimum voltage in the subset. In some example electronic apparatuses, the circuitry may also be configured to program one or more dummy cells of the two or more sub-blocks of the block of NAND memory to have a positive threshold voltage. In some example electronic apparatuses, a sub-block may include at least a first dummy cell included at one end of the NAND string, and at least a second dummy cell included at the other end of the NAND string. Some example electronic apparatuses may also include an electronic memory device including the block of NAND memory, the bit line, the circuitry, and a memory interface, and supervisory circuitry including a controller interface, coupled to the memory interface, to send commands and exchange data compliant with a memory access protocol. In some example electronic apparatuses, the memory access protocol is compliant, at least in part, with an Open NAND Flash Interface (ONFI) specification. In some example electronic apparatuses, the electronic apparatus is a solid state drive. Any combination of the examples of this paragraph may be used in embodiments.

An example electronic apparatus may include a block of NAND memory including two or more sub-blocks coupled to a bit line, a sub-block including a NAND string of two or more memory cells coupled to the bit line, and circuitry coupled to the block of NAND memory. In some example electronic apparatuses, the circuitry may also be configured to erase the block of NAND memory, perform a soft program cycle on the block of NAND memory, determine a subset of the two or more sub-blocks, validate sub-blocks of the subset, execute another soft program cycle on the block of NAND memory if none of the sub-blocks of the subset passes validation, and repeat the validation and the execution until at least one of the sub-blocks of the subset passes validation. In some example electronic apparatuses, the circuitry may also be configured to validate the sub-blocks serially. In some example electronic apparatuses, the circuitry may also be configured to verify the two or more sub-blocks. In some example electronic apparatuses, the circuitry may also be configured to: (a) validate sub-blocks of the subset again, (b) perform another soft program cycle on the block of NAND memory, and repeat (a) and (b) until all of the sub-blocks of the subset pass validation, where (a) skips a sub-block after the sub-block has passed validation. In some example electronic apparatuses, the circuitry may also be configured to check threshold voltages of the two or more sub-blocks against a target maximum voltage, and include sub-blocks that have a threshold voltage higher than the target maximum voltage in the subset. In some example electronic apparatuses, the circuitry may also be configured to check threshold voltages of the two or more sub-blocks against a target minimum voltage, and include sub-blocks that have a threshold voltage lower than the target minimum voltage in the subset. In some example electronic apparatuses, the circuitry may also be configured to program one or more dummy cells of the two or more sub-blocks of the block of NAND memory to have a positive threshold voltage. In some example electronic apparatuses, a sub-block may include at least a first dummy cell included at one end of the NAND string, and at least a second dummy cell included at the other end of the NAND string. Some example electronic apparatuses may also include an electronic memory device including the block of NAND memory, the bit line, the circuitry, and a memory interface, and supervisory circuitry including a controller interface, coupled to the memory interface, to send commands and exchange data compliant with a memory access protocol. In some example electronic apparatuses, the memory access protocol is compliant, at least in part, with an Open NAND Flash Interface (ONFI) specification. In some example electronic apparatuses, the electronic apparatus is a solid state drive. Any combination of the examples of this paragraph may be used in embodiments.

As used in this specification and the appended claims, the singular forms "a", "an", and "the" include plural referents unless the content clearly dictates otherwise. Furthermore, as used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between.

The description of the various embodiments provided above is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described exemplary embodiments, but should be defined only in accordance with the following claims and equivalents thereof.

What is claimed is:

1. A method to erase a block of NAND memory comprising:
performing an erase cycle on a selected block of NAND memory comprising two or more sub-blocks;
determining a subset of the two or more sub-blocks by:
checking threshold voltages of the two or more sub-blocks against a target maximum voltage; and
including sub-blocks that have a threshold voltage higher than the target maximum voltage in said subset;
verifying the two or more sub-blocks in the subset until a sub-block fails to verify;
stopping the verification in response to the failed verify;
performing another erase cycle on the selected block of NAND memory; and
re-starting to verify the two or more sub-blocks at the sub-block that failed to verify.

2. The method of claim 1, further comprising:
(a) stopping the re-started verify in response to another failure to verify a sub-block;
(b) performing another erase cycle on the selected block of NAND memory;
(c) re-starting to verify the two or more sub-blocks at a sub-block that last failed to verify; and
repeating (a), (b) and (c) until no sub-blocks in the selected block of NAND memory fail to verify.

3. The method of claim 1, further comprising:
performing a soft program cycle on the selected block of NAND memory;
determining another subset of the two or more sub-blocks;
validating sub-blocks of said another subset;
executing another soft program cycle on the selected block of NAND memory if none of the sub-blocks of said another subset passes validation;
repeating said validating and said executing until at least one of the sub-blocks of said another subset passes validation; and
re-verifying the two or more sub-blocks.

4. The method of claim 3, wherein said other subset includes a last sub-block to verify.

5. The method of claim 1, wherein the two or more sub-blocks are verified serially.

6. The method of claim 1, further comprising programming one or more dummy cells of the two or more sub-blocks of the selected block of NAND memory to have a positive threshold voltage.

7. A method to erase a block of NAND memory comprising:
erasing a selected block of NAND memory comprising two or more sub-blocks;
performing a soft program cycle on the selected block of NAND memory;
determining a subset of the two or more sub-blocks, by:
checking threshold voltages of the two or more sub-blocks against a target maximum voltage; and
including sub-blocks that have a threshold voltage higher than the target maximum voltage in said subset;
validating sub-blocks of said subset;
executing another soft program cycle on the selected block of NAND memory if none of the sub-blocks of said subset pass validation; and
repeating said validating and said executing until at least one of the sub-blocks of said subset passes validation.

8. The method of claim 7, wherein the sub-blocks of said subset are validated serially.

9. The method of claim 7, further comprising verifying the two or more sub-blocks.

10. The method of claim 7, further comprising:
(a) validating the sub-blocks of said subset again;
(b) performing another soft program cycle on the selected block of NAND memory; and
repeating (a) and (b) until all of the sub-blocks of said subset pass validation;
wherein said (a) validating the sub-blocks of said subset again skips a sub-block after a sub-block being validated has passed validation.

11. The method of claim 7, further comprising programming one or more dummy cells of the two or more sub-blocks of the selected block of NAND memory to have a positive threshold voltage.

12. An electronic apparatus comprising:
a block of NAND memory comprising two or more sub-blocks coupled to a bit line, a sub-block comprising a NAND string of two or more memory cells coupled to the bit line; and
circuitry coupled to the block of NAND memory, the circuitry being configured to:
execute an erase cycle on the block of NAND memory;
check threshold voltages of the two or more sub-blocks against a target maximum voltage; and
include sub-blocks that have a threshold voltage higher than the target maximum voltage in a subset;
verify the two or more sub-blocks in the subset until a sub-block fails to verify;
stop the verification in response to the failed verify;
perform another erase cycle on the block of NAND memory;
re-start to verify the two or more sub-blocks at the sub-block that failed to verify; and
repeat said stop, said perform and said re-start until no sub-blocks in the block of NAND memory fail to verify.

13. The electronic apparatus of claim 12, the circuitry further configured to:
perform a soft program cycle on the block of NAND memory;
determine another subset of the two or more sub-blocks;
validate the sub-blocks of said another subset;
execute another soft program cycle on the block of NAND memory if none of the sub-blocks of said another subset passes validation;
repeat the validation and the execution until at least one of the sub-blocks of said another subset passes validation; and
re-verify the two or more sub-blocks.

14. The electronic apparatus of claim 13, wherein said another subset includes a last sub-block to verify.

15. The electronic apparatus of claim 12, the circuitry further configured to:
program one or more dummy cells of the two or more sub-blocks of the block of NAND memory to have a positive threshold voltage;
wherein a sub-block comprises:
at least a first dummy cell included at one end of said NAND string; and
at least a second dummy cell included at the other end of said NAND string.

16. The electronic apparatus of claim 12, further comprising supervisor circuitry comprising a controller interface, coupled to the memory interface, to send commands and exchange data compliant with a memory access protocol, wherein the memory access protocol is compliant, at least in part, with an Open NAND Flash Interface (ONFI) specification.

17. The electronic apparatus of claim 12, wherein the electronic apparatus is a solid state drive.

18. An electronic apparatus comprising:
a block of NAND memory comprising two or more sub-blocks coupled to a bit line, a sub-block comprising a NAND string of two or more memory cells coupled to the bit line; and circuitry coupled to the block of NAND memory, the circuitry being configured to:
erase the block of NAND memory;
check threshold voltages of the two or more sub-blocks against a target maximum voltage; and
include sub-blocks that have a threshold voltage higher than the target maximum voltage in a subset;
verify the two or more sub-blocks in the subset until a sub-block fails to verify;
perform a soft program cycle on the block of NAND memory;
determine a subset of the two or more sub-blocks;
validate sub-blocks of said subset;
execute another soft program cycle on the block of NAND memory if none of the sub-blocks of said subset passes validation; and
repeat said validation and said execution until at least one of the sub-blocks of said subset passes validation.

19. The electronic apparatus of claim 18, the circuitry further configured to verify the two or more sub-blocks.

20. The electronic apparatus of claim 18, the circuitry further configured to:
(a) validate sub-blocks of said subset again;
(b) perform another soft program cycle on the block of NAND memory; and
repeat (a) and (b) until all of the sub-blocks of said subset pass validation;
wherein (a) skips a sub-block after the sub-block has passed validation.

21. The electronic apparatus of claim 18, the circuitry further configured to:
program one or more dummy cells of the two or more sub-blocks of the block of NAND memory to have a positive threshold voltage;
wherein a sub-block comprises:
at least a first dummy cell included at one end of said NAND string; and
at least a second dummy cell included at the other end of said NAND string.

22. The electronic apparatus of claim 18, wherein the electronic apparatus is a solid state drive.

* * * * *